(12) United States Patent
Martin Hernandez (10) Patent No.: US 10,774,558 B2
(45) Date of Patent: Sep. 15, 2020

(54) EARTHQUAKE PROTECTION SYSTEM FOR A FLOATING SLAB

(71) Applicant: TEJASA-TC, S.L.L., El Astillero (Cantabria) (ES)

(72) Inventor: Juan Jose Martin Hernandez, El Astillero (ES)

(73) Assignee: TEJASA-TC, S.L.L., El Astillero (Cantabria) (ES)

( * ) Notice: Subject to any disclaimer, the term of this patent is extended or adjusted under 35 U.S.C. 154(b) by 37 days.

(21) Appl. No.: 16/096,158

(22) PCT Filed: Apr. 29, 2017

(86) PCT No.: PCT/ES2017/070267
§ 371 (c)(1),
(2) Date: Oct. 24, 2018

(87) PCT Pub. No.: WO2017/187003
PCT Pub. Date: Nov. 2, 2017

(65) Prior Publication Data
US 2019/0136564 A1    May 9, 2019

(30) Foreign Application Priority Data
Apr. 29, 2016   (ES) .................................. 201630563

(51) Int. Cl.
*E04H 9/02*      (2006.01)
*F16F 15/04*     (2006.01)
(Continued)

(52) U.S. Cl.
CPC .............. *E04H 9/021* (2013.01); *E04H 9/02* (2013.01); *E04H 15/22* (2013.01); *F16F 15/04* (2013.01);
(Continued)

(58) Field of Classification Search
CPC ...... F16F 15/04; F16F 15/085; F16F 2236/12; F16F 2224/025; F16F 2224/0208;
(Continued)

(56) References Cited

U.S. PATENT DOCUMENTS 2,055,000 A * 9/1936 Bacigalupo ............. E04H 9/023
52/167.6
3,606,704 A * 9/1971 Denton ................. E04F 15/024
52/167.8
(Continued)

FOREIGN PATENT DOCUMENTS

EP   0610634 A1 *  8/1994   ............. E04F 15/22
EP   1300526 A1 *  4/2003   ............ E04F 15/225
(Continued)

*Primary Examiner* — Adriana Figueroa
(74) *Attorney, Agent, or Firm* — Soroker Agtmon Nordman (57) ABSTRACT

Earthquake protection system for a floating slab (1), for the conservation of the structures placed on the slab against the dynamic forces caused by earthquakes, comprising one or more vertical holding devices, arranged on the floating slab (1), and one or more side dampers (20), located on the side walls of the floating slab (1), wherein vertical holding devices are configured for the limitation and damping of the vertical movement of the floating slab and wherein the side dampers (20) are configured to limit and damp the movement of the floating slab (1) in the horizontal direction. The invention also comprises a protection method against earthquakes for protecting that which is arranged on the floating slabs.

14 Claims, 6 Drawing Sheets

(51) Int. Cl.
  *E04H 15/22* (2006.01)
  *H05K 7/14* (2006.01)
  *F16F 15/08* (2006.01)
(52) U.S. Cl.
  CPC ......... *F16F 15/085* (2013.01); *H05K 7/1495* (2013.01); *F16F 2224/025* (2013.01); *F16F 2224/0208* (2013.01); *F16F 2236/12* (2013.01)
(58) Field of Classification Search
  CPC ........ E04H 9/021; E04H 9/02; H05K 7/1495; H05K 7/1488
  USPC .................................. 52/167.4, 167.7, 167.8
  See application file for complete search history.

(56) References Cited

U.S. PATENT DOCUMENTS

| | | | | |
|---|---|---|---|---|
| 4,599,834 | A * | 7/1986 | Fujimoto | E02D 27/34 |
| | | | | 376/285 |
| 4,766,708 | A * | 8/1988 | Sing | E04B 1/98 |
| | | | | 52/167.8 |
| 4,899,323 | A * | 2/1990 | Fukahori | E04B 1/36 |
| | | | | 248/560 |
| 5,201,155 | A * | 4/1993 | Shimoda | E01D 19/041 |
| | | | | 248/634 |
| 5,761,856 | A * | 6/1998 | Kishizono | F16F 15/08 |
| | | | | 52/167.8 |
| 5,765,322 | A * | 6/1998 | Kubo | E04H 9/022 |
| | | | | 248/634 |
| 6,457,285 | B1 * | 10/2002 | Valencia | E04H 9/021 |
| | | | | 52/167.2 |
| 7,856,766 | B2 * | 12/2010 | Takenoshita | E04H 9/022 |
| | | | | 248/636 |
| 9,198,310 | B2 * | 11/2015 | Eichelberg | H05K 7/20745 |
| 9,572,279 | B2 * | 2/2017 | Tabe | H05K 7/1497 |
| 2010/0281815 | A1 * | 11/2010 | Martin Hernandez | E04F 15/22 |
| | | | | 52/687 |

FOREIGN PATENT DOCUMENTS

| | | | | |
|---|---|---|---|---|
| EP | 1347117 A1 * | 9/2003 | | E04F 15/225 |
| ES | 2315182 A1 | 3/2009 | | |
| JP | 61049028 A * | 3/1986 | | E02D 27/34 |
| JP | 01055446 A * | 3/1989 | | F16F 13/00 |
| JP | 01260137 A * | 10/1989 | | |
| JP | 01320345 A * | 12/1989 | | F16F 13/00 |
| JP | 02248551 A * | 10/1990 | | |
| JP | 03204420 A * | 9/1991 | | |
| JP | H09177371 A | 7/1997 | | |
| JP | 2000265479 A | 9/2000 | | |
| JP | 2003160991 A | 6/2003 | | |
| JP | 2005061211 A | 3/2005 | | |
| JP | 2016056875 A | 4/2016 | | |
| WO | WO-2006007791 A1 * | 1/2006 | | E01B 19/003 |
| WO | WO2016031322 A1 | 3/2016 | | |

* cited by examiner

EARTHQUAKE PROTECTION SYSTEM FOR A FLOATING SLAB

OBJECT OF THE INVENTION

The present invention, as indicated in the title, relates to a protection system for a floating slab against forces and accelerations produced by an earthquake, in order to conserve the structure placed on the floating slab.

This invention also describes the distinctive features of the protection method for the floating slab.

TECHNICAL FIELD OF THE INVENTION

This invention is specifically designed for the safety of any device or machine that is placed on a floating slab, in particular it is designed for the protection of equipment, computers and electronic components, data processing centres, DPC, which large companies, organisations and military institutions use for the storage and conservation of their data. It is also applicable to laboratories and, in general, any installation with sensitive material or equipment for its protection against earthquakes.

The invention allows isolating this equipment from the forces and vibrations produced by seismic waves.

STATE OF THE ART

Various systems for protection of constructions against seismic forces which seek to isolate the construction and/or its structural elements from the surface waves that occur in an earthquake are known. These waves are of different intensity and wavelength, acting on the constructions with forces in the vertical and horizontal direction.

The fundamental principle of isolation from seismic waves is knowing the structure's frequency, and avoiding that this frequency matches the frequency of the seismic wave, because, in that case, it would enter into resonance and thus the forces and effects of the earthquake would multiply.

Floating floors or floating slabs of reinforced concrete, defined as an independent floor and at the same level as the rest of the concrete slab formwork, which is supported on a rigid base by elastic elements, usually helical spring dampers, are known in the state of the art. They are used to prevent transmission of vibrations or impact noises produced in the operation of the devices or machines placed on the slab to the rest of the building or structure.

The slabs are made in the reinforced concrete slab formwork, which is a concrete reinforced with a framework of welded wire fabric generally composed of two meshes, each of which is formed by bars or rods arranged some in the vertical direction and others in the horizontal direction, crossing over each other forming grids; the meshes placed superposed one above the other making the respective grids coincide. For the forming of the floating slab a series of containers are placed in the ground, whose bases have proportions smaller than the grid of the meshes, and at a height related to that which the slab will have, and arranged at regular distances to cover and configure the dimensions of the floating slab. The containers will be fixed by different means to the meshes to form an integral part of the slab formwork after the pouring and drying of the concrete. In this regard, the applicant is the holder of the patent ES 2 315 182, which provides the assembly of the meshes, and claims containers which have tubes in their walls at two different levels, tubes in which rods are inserted which protrude from the tubes upon which the bars of the first mesh are supported on the tubes of the lower level, and the bars of the second mesh on the tubes of the upper level.

To isolate the floating slab from the rest of the rigid slab formwork, several solutions are known: pouring liquid rubber into the top of the gap existing between the walls of the floating slab and the walls of the rest of the slab formwork; placing rock wool, etc.

The use of floating slabs to protect structures that are arranged on them from earthquakes is known, but it fails to carry out this function properly as the floating slabs are designed to avoid the transmission of vibrations produced by the machine or device located on the floating slab to the foundation.

The object of the patent is the use of floating slabs for protection against the accelerations and forces produced by an earthquake on the equipment installed in the data processing centres (DPC); i.e., what is sought is that seismic waves will not be transmitted from the foundation to these components, contrary to the usual use of the floating slab, where it is sought that the vibrations of the machine which is placed on the slab are not transmitted to the foundation and spread through the rest of the building.

The equipment making up the data protection centres, DPC, which are network connected servers or hard drives for data storage, are located in cabinets or shelves, internationally called "racks", which are independent but in contact with each other at their sides, and they may be in the room in one or more rows, each row separated by one or more metres. These racks are usually placed on a raised access floor, which is a floor raised by pedestals from a support structure and is presented divided into tiles, it's purpose being the array and concealment under this raised access floor of the wiring and ducts that these workplaces have.

To ensure the safety of this sensitive equipment and components against earthquakes, the movements and vibrations that are transmitted from the foundation to the racks, where the computers are found, must be minimal.

DESCRIPTION OF THE INVENTION

The invention is a system to provide protection against earthquakes for a floating slab on which sensitive equipment or components are placed, which may be located either on the slab itself in racks, cabinets or shelves, or these shelves being located on a raised access floor which is on the floating slab.

In this patent, the names cabinets, shelves or racks are used to refer to the same concept.

The object of the invention is to provide the slab with comprehensive protection, protection both against the accelerations and the horizontal forces as well as the vertical forces caused by the earthquake, having means to isolate vibrations which are transmitted from the floating slab to the raised access floor, as well as the vibrations or forces that are transmitted to the racks that are on the raised access floor, all with the purpose of protecting the equipment. The invention is primarily intended for the protection of equipment from a data protection centre, DPC, or sensitive equipment in military installations.

The system comprises one or more dampers arranged in the floating slab with the function of limiting and damping the vertical movement of the floating slab; and one or more side dampers, located on the side walls of the floating slab, that are configured to limit and damp the movement of the floating slab in the horizontal direction.

The dampers which are arranged in the floating slab to limit the vertical displacement and to avoid the slab entering into resonance are introduced into the rigid base in the construction phase of the slab, and they are stems perpendicular to the base, containing at their lower end legs that are embedded in the concrete of the base or a piece with articulated function. For this, in the construction phase, containers are arranged in the welded wire fabric, located so that their centre coincides with the centre of the stems that have been arranged anchored in the rigid base. These containers have an inward facing flange on their lower walls. Once the slab has been raised to the desired height, on each of the stems a set of washers of different diameters will be placed, whose disc on each one of them has the same width but their central hole diameters being different. Said washers are placed from larger to smaller, the largest one being arranged on the inward facing flange which the container has in its lower area, a damper being placed on the smaller washer, containing a bore in its central area for insertion through the stem, and this configuration of washers and damper is closed with a nut which is screwed on the upper end of the stem. These vertical holding devices composed of the stem, the washers and the damper, limit the vertical movement of the floating slab.

The system comprises one or more side dampers, located on the side walls of the floating slab to limit and damp the movement of the floating slab in the horizontal direction.

The system comprises a series of chocks: The floating slab is configured by the arrangement in the rigid base, where the slab rests, of a series of chocks which protrude from the base, arranged at regular distances between each other, and defining the support surface of the future floating slab; these chocks having on their top a concave surface, which will be embodied by planning its shape and dimensions according to the energy that is desired to be absorbed. Subsequently, a container will be positioned on each chock, whose function is to house a helical spring damper comprising two covers, an upper cover on which is installed a piece in an inverted "U"-shape, having a screw in its central part which, by its lower end, presses the upper cover; and a lower cover whose end is supported in the rigid base where the floating slab rests. In this embodiment, this lower cover of the helical spring has a convex shape to rest on one of the chocks arranged on the base which has a concave shape.

Thus, for the creation of the floating slab, liquid concrete is poured and when set, a helical spring damper is introduced into each container. These helical springs are those which raise the floating slab, once the concrete has set, using the movement of the screw of the central area which presses the upper cover downwards, achieving pressure of the helical spring damper on the lower cover and thus the progressive lifting of the floating slab.

The pressure screw of the upper cover of the helical spring damper may have, in another embodiment, an articulated support in the "U"-shaped piece, which admits greater movement in the case of an intense earthquake.

In areas of high seismic intensity, reinforcements are installed that prevent the inverted "U"-shaped piece from being displaced.

In one embodiment, within these helical spring dampers pads of stainless steel wire are installed.

In another embodiment, in the construction phase, other "U"-shaped containers are placed on the edges of the welded wire fabric, in the area which defines the side walls of the floating slab. They are containers whose open part in said "U"-shape is arranged on the edge of the wall, the open part being opposite the wall of the rigid area of the concrete slab formwork. They can be installed in the floating slab or in the rigid area of the rest of the concrete slab formwork, the open part of the "U"-shape being opposite the walls of the floating slab.

In each one of said "U"-shaped containers, a side damper device is installed comprising a tubular metal sleeve, in one embodiment circular, to be closed at its other end by another circular tubular metal sleeve of lesser section than the previous one and whose end is inserted into it, ensuring the telescopic movement. A series of cylindrical steel cable dampers having a central bore are installed inside, which are placed pressed against each other by the bases of the two sleeves, one of the bases of one of the sleeves to be installed in the front wall of the container and the base of the other sleeve to be installed in contact with the wall of the concrete slab formwork. These side dampers limit and damp the horizontal movement of the floating slab.

In one embodiment, within these steel cable dampers with central bore, a rubber cylinder containing embedded in the rubber mass a helical damper of rectangular section is installed. This arrangement provides advantages by avoiding that the rubber cylinder can be bowed on compression, as well as the rubber being able to support the load that the steel cable damper installed therein supports, plus that which the rubber can support; these loads are progressively supported by the rubber cylinder and its helical damper, which makes this arrangement useful in earthquakes of low, medium high and very high intensity, eliminating a lot of seismic wave energy, since the exterior of the rubber undergoes a very high friction force on being compressed.

Steel cable damper discs are also installed attached to the walls of the floating slab, which will begin to function when the side dampers have exhausted their travel.

The racks, cabinets and shelves can be positioned on the floating slab in direct contact with it, but usually a raised access floor is placed on the floating slab by pedestals which are supported on the floating slab to place tiles thereon. In this case, the perimeter of the raised access floor consisting of tiles is surrounded by a square rail, from which the stems, directed perpendicularly towards the pedestals, emerge, and each one of the stems ends in a steel cable damper which contacts one of the pedestals located at the edge of this raised access floor.

On the raised access floor are arranged one or several rows of shelves or cabinets containing legs, each ending in a damper that rests on the raised access floor; the damper being able to be installed directly at each corner of the cabinet in the case that it does not have legs. Each side wall of one of the cabinets contacts the next cabinet, one or more dampers being arranged between the walls of two adjacent cabinets. In addition, at the top, at the edge of two adjacent cabinets, said cabinets are linked by a damper arranged between two pieces, brackets, each one of which being located on one of the cabinets.

In the case that there is more than one row of cabinets, the different rows are related or linked by means of a metal strip anchored to the top of the cabinet and directed towards another metal strip that is anchored at the top of the cabinet located in another row, the two metal strips being linked in a damper.

The dampers, whether of steel cable, rubber, . . . can be replaced by others that fulfil the same function, depending on the needs or forecasts of the accelerations and/or seismic vibrations of the floating slab's place of location.

With the features of this method of configuration of the floating slab, raised access floor and cabinets set forth, and the system that configures the comprehensive protection of the floating slab and upper structures, the following is obtained:

- The elimination of vibrations through the helical springs that are arranged in the containers and have the purpose to raise the slab in its construction phase and to isolate the seismic vibrations.
- The elimination and/or damping of side impacts, through the lateral pads, progressively braking the horizontal forces.
- The dissipation of the energy caused by the earthquake, by means of the chocks located on the rigid base, which allow a displacement of the slab with friction on the chocks causing the impact of the floating slab against the walls of the rest of the concrete slab formwork with ostensibly less energy than that transmitted from the foundation.
- The damping located on the stem which is positioned in the rigid base, limiting the vertical movement of the floating slab; and the group of washers located around the stem cause transformation of the vertical force into horizontal displacement of the slab, said displacement to be damped by the side dampers and the complementary damper discs.
- The protection of the dampers located on the pedestals of the raised access floor allows to eliminate the vibrations that are transmitted from the floating slab; the same as the dampers of the bases of the cabinets and those located between the cabinets.
- The dampers that are positioned between two cabinets or between two rows of cabinets have the purpose of joining the cabinets or linking the rows of cabinets to form a block that is elastically joined, and this union producing an absorption and dissipation of the energy from the movements of the block.

With the ultimate aim that vibrations that are transmitted to equipment located inside the cabinets, racks, be eliminated or do not cause any alteration in their operation.

DESCRIPTION OF FIGURES

In order to complement the description that is being carried out and with the purpose of facilitating the understanding of the features of the invention, the present description is accompanied by a set of drawings wherein, by way of a non-limiting example, the following has been represented.

PREFERRED EMBODIMENT OF THE INVENTION

Figure 1:
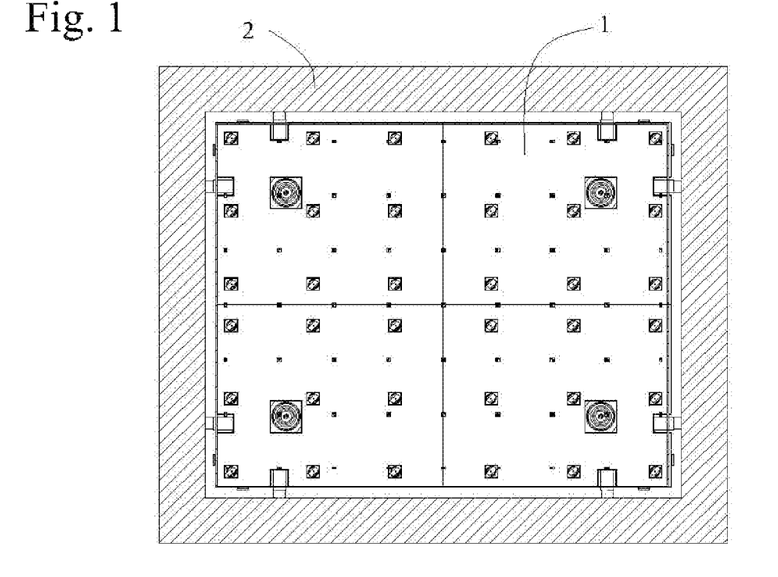
FIG. 1 is a top plan view of the floating slab within the rest of the slab formwork.
Figure 2:
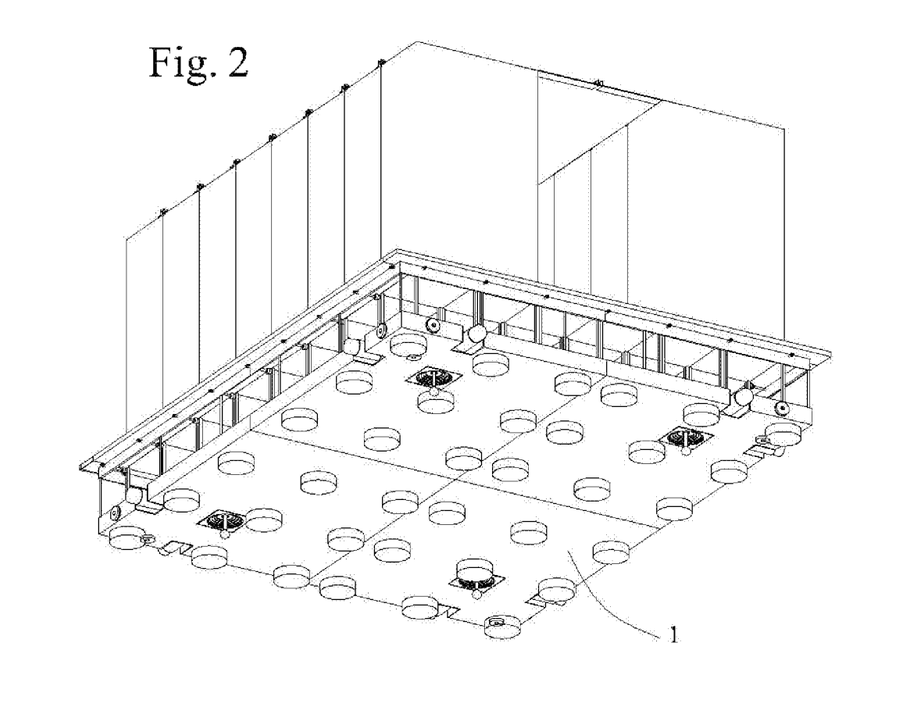
FIG. 2 is a lower perspective view of the whole, floating slab, raised access floor and racks with equipment.

The floating slab (1) is quadrangular and is embodied on a rigid base (B) and has around it the rest of the concrete slab formwork (2). Between the slab formwork (2) and the floating slab (1) there is a gap as shown in FIG. 1.

On the rigid base (B) are arranged a series of chocks (8), wherein these can be installed before the formation of the floating slab, or positioned once it is raised.

Figure 3:
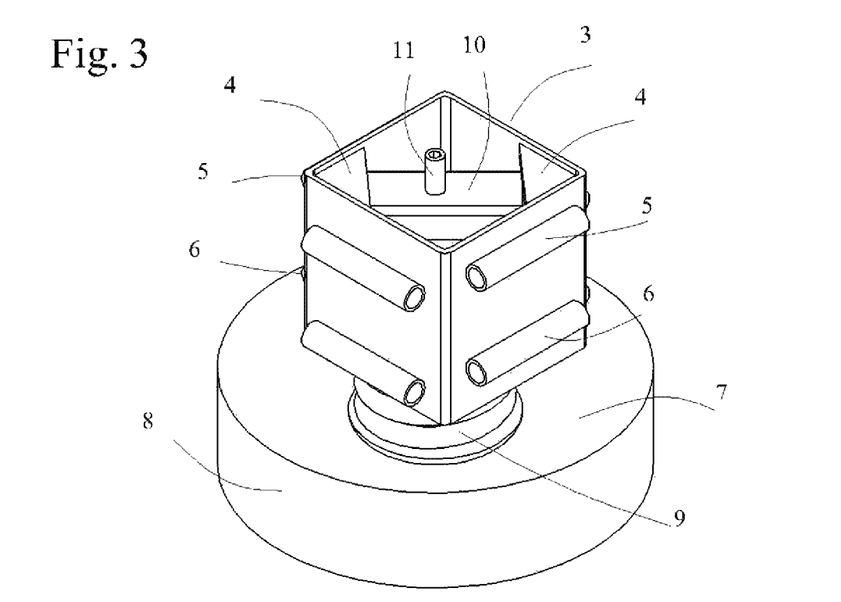
FIG. 3 is a perspective view of a container with the helical spring on a chock.

On each chock (8) a container (3) is located, which in this embodiment is square, having on each of its two corners, on the top of its inner walls, a bevel (4).

In the exterior walls, the container has tubes (5, 6) at different levels to place the meshes that make up the welded wire fabric, which are held (top and bottom mesh) on rods that are inserted into these tubes. On these rods, on the rods which are arranged at the lower level, is positioned a first mesh and, on the rods which are arranged in the upper tubes, a second mesh, to thus configure the welded wire fabric or framework. The rods and the meshes are not shown in the drawings as they are not an object of this invention.

Figure 4:
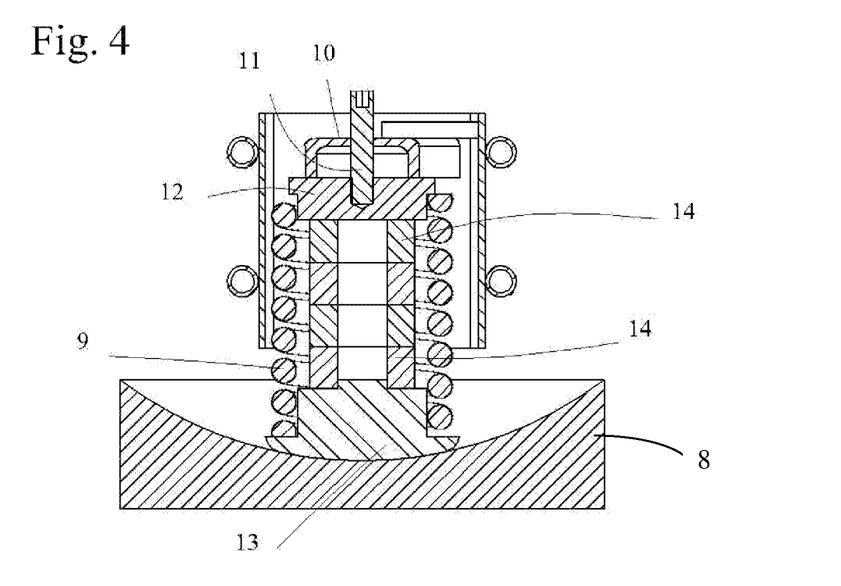
FIG. 4 shows the previous figure sectioned by a vertical plane.
Figure 5:
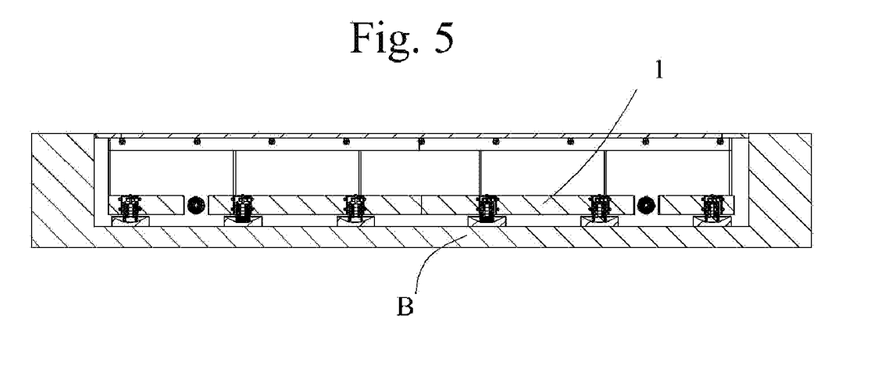
FIG. 5 shows a sectional view of the floating slab with a container and helical spring on a chock.
Figure 6:
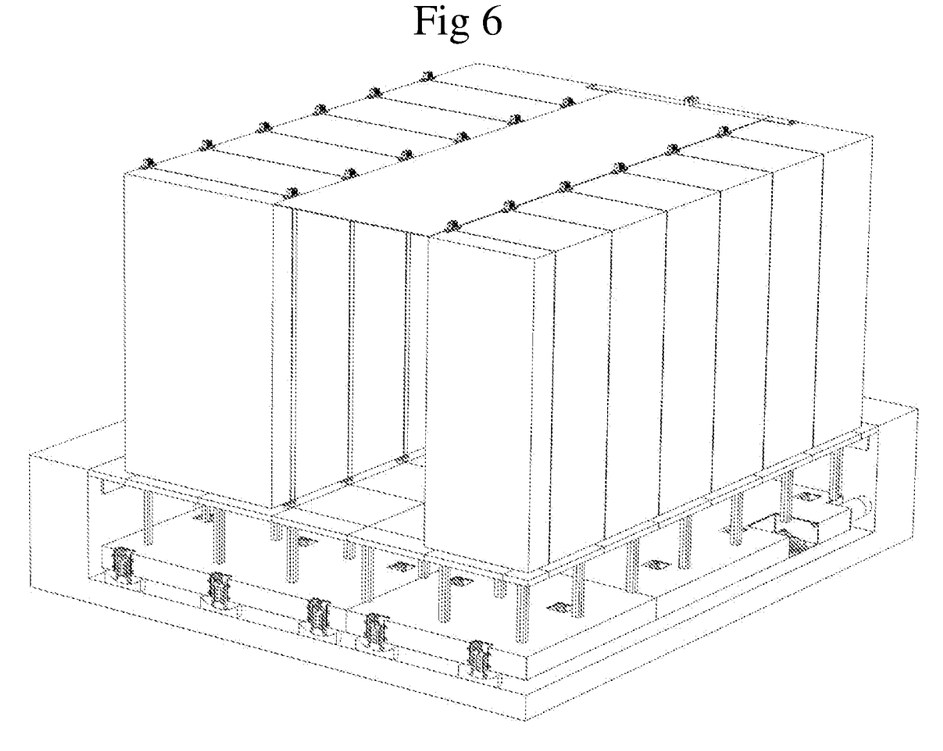
FIG. 6 is a perspective view of the whole, the floating slab sectioned by vertical planes.

The helical spring (9) that is inserted into the container (3) when the concrete has already set has metal pads (14) in its interior. Said damper, helical spring (9), is closed at its top and bottom with a cover (12, 13), respectively. On its top it has an inverted "U"-shaped piece (10) that is positioned under the bevels (4), this piece having a screw (11) in its central part that presses the top cover (12) downward, achieving pressure of the helical spring (9) damper on the bottom cover (13) with convex shape, this being in contact with the concavity of the chock (8) on its top; this pressure allowing the progressive lifting of the floating slab (1) by the drive of all the helical springs (9).

Figure 7:
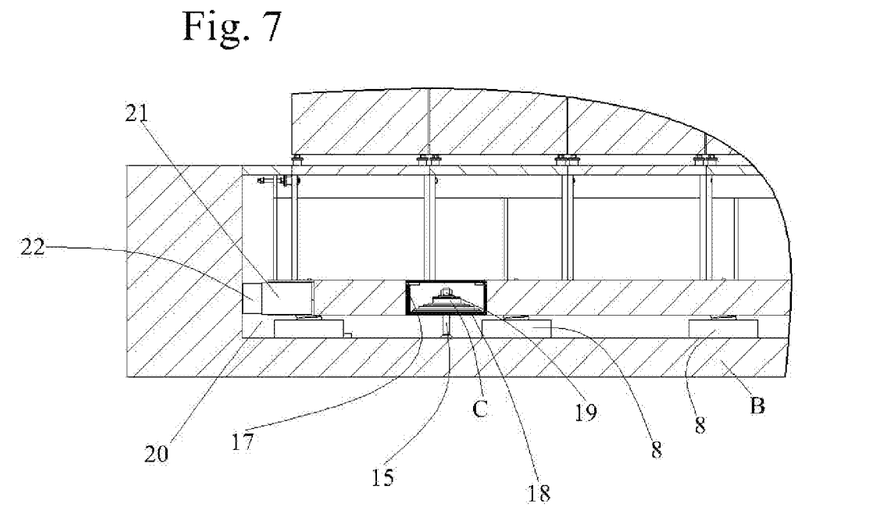
FIG. 7 shows a sectional view of the floating slab sectioned by a vertical plane.
Figure 8:
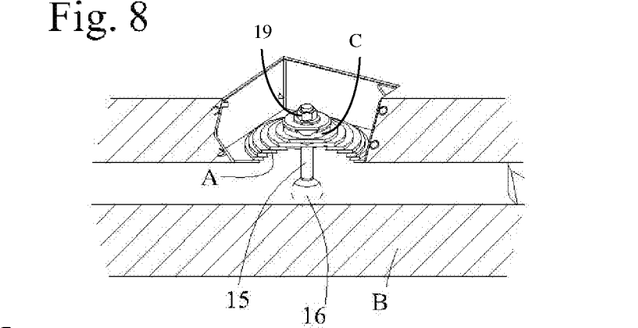
FIG. 8 is a detail of the previous figure.

As is shown in FIGS. 7 and 8, each vertical damper comprises a stem (15) anchored perpendicular to the base (B) and introduced into the base (B) by its lower end (16), with a group of washers (A) of different diameters which are arranged inserted in the stem (15) and rest, arranged from larger to smaller on a flange (18) towards the interior which has a container (17).

These stems (15) are arranged centred within containers (17) having a flange (18) towards the interior, which are placed on top of the flange (18) washers (A) of different diameters, from larger to smaller, on top of which is placed a steel cable damper (C), closing the device by means of a nut (19).

Figure 9:
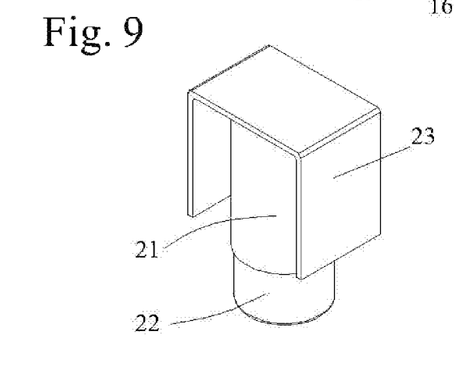
FIGS. 9 and 10 are perspective and sectional views of a side damper.
Figure 10:
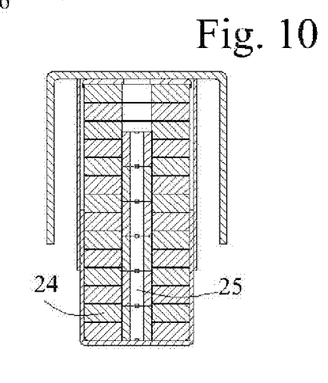

In FIGS. 7 and 9, the side dampers (20) installed on the edges of the floating slab (1) in "U"-shaped containers (23) which are placed in contact with the walls of the rest of the rigid slab formwork (2), are shown. The side damper (20) consists of steel cable damper cylinders (24) that are restrained inside two tubular sleeves (20, 21) with circular section: one sleeve (21) of greater section into which another sleeve (22) of lesser section and with the possibility of displacement through its interior is inserted. In the central bore containing the interior of the damper cylinders (24), a rubber damper (25) is placed which contains in its structure, in the rubber mass, another helical damper, not shown, being in this embodiment of rectangular section. The side dampers (20) in this embodiment end in a curved shape in their area of contact with the opposite wall.

As a complementary reinforcement to avoid lateral displacement, on the walls of the slab (1) damper discs (31), shorter than the side dampers (20) are installed which begin to function when the travel of the side dampers (20) is exhausted.

Figure 11:
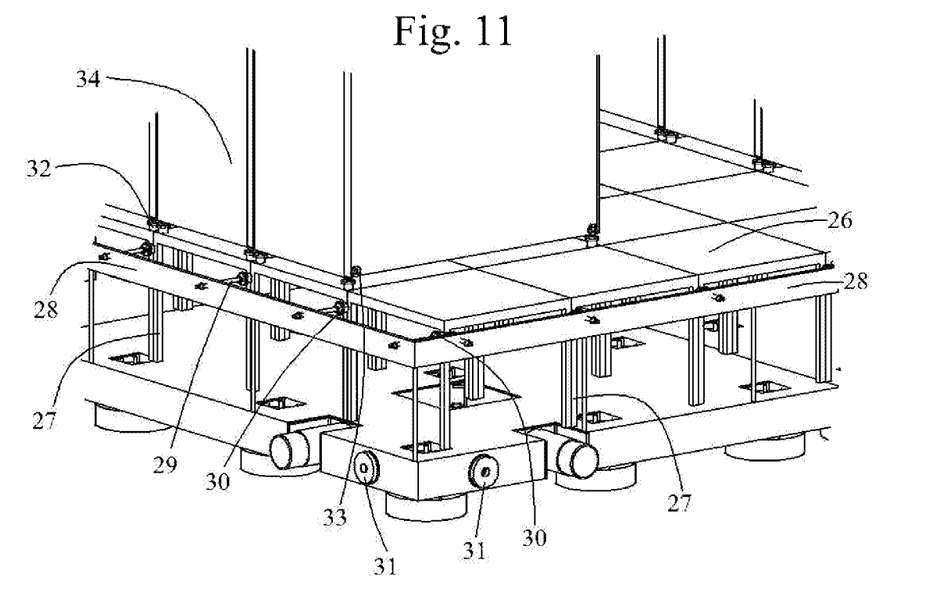
FIG. 11 is a perspective view of the floating slab with the raised access floor.

In this embodiment, on the floating slab (1), a raised access floor consisting of pedestals (27), which are perpendicular to the slab (1) and positioned thereon, and tiles (26) are installed that make up said floor. On the perimeter of the line of tiles is placed a rail (28) from which stems (29) emerge towards the nearest pedestals (27) and which end in a damper (30) which is in contact with one of the pedestals (27). In this arrangement, the pedestals (27) located at the corners contact two dampers (30), each of which emerges from a stem (29) located on one of the sides forming the corner of the rail (28).

Figure 12:
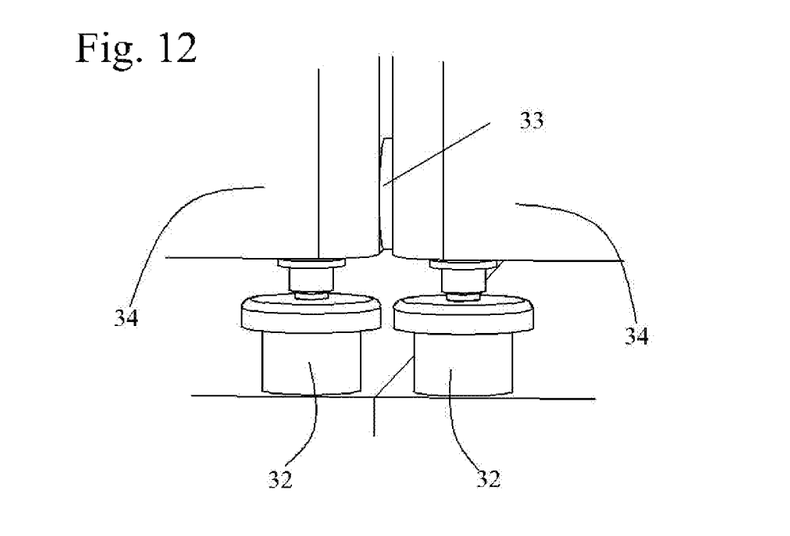
FIG. 12 shows damper components of the cabinets, racks.

On the floating slab (1), cabinets (34) whose base is quadrangular and with a damper (32) for each of the legs of the cabinet or corners of the base, are located.

The cabinets (34) are in contact with their side walls, dampers (33) being arranged in these areas of contact.

Figures 14, 15:
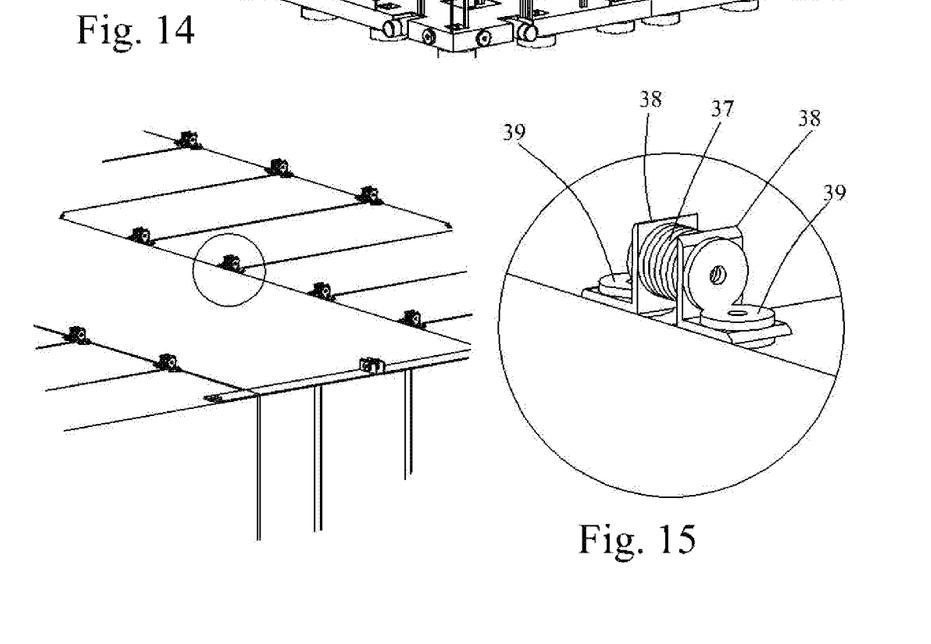
FIG. 14 is a view of the upper dampers.
FIG. 15 is a detail of the previous figure.

The adjacent cabinets (34) are joined at their top by rubber dampers (37) arranged between two bracket-shaped pieces (38), each one thereof resting on one of the cabinets by means of another rubber damper (39).

Figure 13:
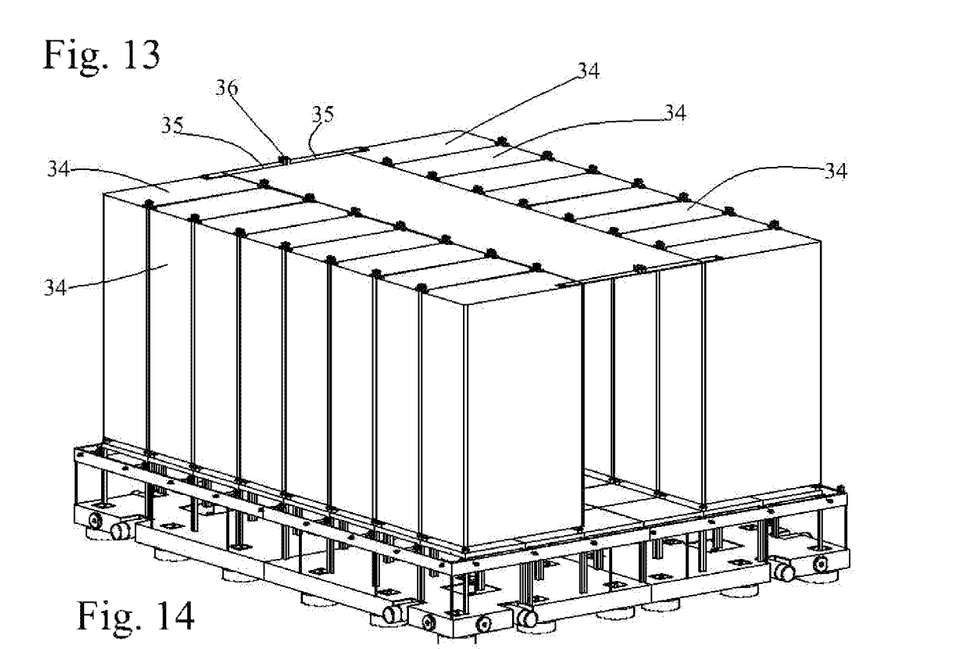
FIG. 13 shows the linking system of the racks on their top.

The different rows of cabinets are joined by two metal strips (35) emerging from a cabinet of a different row to be linked in a damper (36) in the middle of the two metal strips (35).

Once the nature of the invention as well as an example of preferred embodiment have been sufficiently described, it is stated for all pertinent purposes that the materials, form, size and arrangement of the elements described are susceptible to changes, provided these do not involve an alteration of the essential features of the invention that are claimed subsequently.

The invention claimed is:

1. An antiseismic protection system for a floating slab (1), for the conservation of structures placed on the slab (1) against the dynamic forces caused by earthquakes; the system comprising a floating slab (1), a rigid base (B) and a concrete slab formwork (2), wherein the slab (1) is located on the rigid base (B) and its side walls adjoin with those of the concrete slab formwork (2); further wherein the floating slab (1) is constituted by means of distribution of containers (3) in welded wire fabric, and once the concrete is set, within each of the containers (3) a helical spring damper (9) is introduced with a lower cover (13), said lower cover (13) is positioned on the rigid base (B), raising the floating slab (1) by the drive of the helical spring dampers (9) against the rigid base (B), said system further comprising one or more side dampers (20), located in the side walls of the floating slab (1), configured to limit and damp the movement of the floating slab (1) in the horizontal direction, said system further comprising a vertical holding device configured to limit and damp the vertical movement of the floating slab, said vertical holding device comprising a stem (15) anchored perpendicular to the rigid base (B) and a group of washers (A) with different diameters that are inserted in the stem (15) and are arranged from larger to smaller on a flange (18) towards the interior of the flange (18) within a container (17).

2. The antiseismic protection system for a floating slab according to claim 1, wherein the base (B) comprises chocks (8) on which the helical spring dampers (9) are arranged.

3. The antiseismic protection system for a floating slab according to claim 2, wherein the lower cover (13) of the helical spring damper (9) has a convex shape, to be positioned on the top of the chock (8) having a concave shape.

4. The antiseismic protection system for a floating slab according to claim 1, wherein stainless steel wire pads (14) are installed on the inside of the helical spring damper (9).

5. The antiseismic protection system for a floating slab (1) according to claim 1, wherein the side dampers (20) are arranged on the edges of the floating slab (1) and comprise a tubular metal sleeve (21) containing an opening to introduce another tubular metal sleeve (22) of lower section, contained within steel cable damper cylinders (24).

6. The antiseismic protection system for a floating slab (1) according to claim 5, wherein the side dampers (20) are of circular section contained within the sleeves (21, 22) and further wherein the steel cable damper cylinders (24) contain a bore in a central part of the steel cable damper cylinders (24).

7. The antiseismic protection system for a floating slab (1) according to claim 6, wherein a rubber damper (25) is arranged in the central bore of the steel cable damper cylinders (24).

8. The antiseismic protection system for a floating slab (1), according to claim 7, wherein the rubber damper (25) contains within its rubber mass a helical damper.

9. The antiseismic protection system for a floating slab (1), according to claim 1, wherein said system comprises damping discs (31) attached to the side walls of the floating slab (1) which activate when the side dampers (20) are at their limit of damping capacity.

10. The antiseismic protection system far a floating slab (1), according to claim 1, wherein on the upper end of the stem (15) a damper (C) is arranged.

11. The antiseismic protection system for a floating slab (1), according to claim 1, wherein the lower end of the stem is articulated (16).

12. The antiseismic protection system for a floating slab (1), according to claim 1, wherein the structures on top of the floating slab (1) comprise a raised access floor with pedestals (27) and tiles (26), and a rail (28) placed on the perimeter of said raised access floor from which stems (29) emerge with a damper (30) at its end in contact with one of the pedestals (27).

13. The antiseismic protection system for a floating slab, according to claim 1, wherein the structures that are on the top of the floating slab (1) are cabinets (34), wherein side dampers (33) are arranged between the side walls of two adjacent cabinets (34) and top dampers (37) are placed on the top of the two adjacent cabinets (34).

14. The antiseismic protection system for a floating slab according to claim 1, wherein the structures that are on the floating slab (1) are cabinets (34) grouped in different rows, a cabinet of one row being linked with one of another row by a metal strip (35) emerging from each cabinet (34) to connect with the metal strip (35) emerging from the cabinet (34) of another row through a damper (36).

* * * * *